United States Patent [19]

Oshida et al.

[11] Patent Number: 4,701,050

[45] Date of Patent: Oct. 20, 1987

[54] SEMICONDUCTOR EXPOSURE APPARATUS AND ALIGNMENT METHOD THEREFOR

[75] Inventors: Yoshitada Oshida, Fugisawa; Masataka Shiba, Yokohama; Naoto Nakashima, Yokohama; Toshihiko Nakata, Yokohama; Sachio Uto, Yokohama, all of Japan

[73] Assignee: Hitachi, Ltd., Tokyo, Japan

[21] Appl. No.: 702,329

[22] Filed: Aug. 5, 1985

[30] Foreign Application Priority Data

Aug. 10, 1984 [JP] Japan ................................ 59-166597
Aug. 31, 1984 [JP] Japan ................................ 59-180531
Sep. 21, 1984 [JP] Japan ................................ 59-196645

[51] Int. Cl.$^4$ ........................ G01B 11/26; G01C 1/00
[52] U.S. Cl. .................................... 356/152; 250/202
[58] Field of Search ............... 356/152, 141; 250/202, 250/201

[56] References Cited

U.S. PATENT DOCUMENTS

| | | | |
|---|---|---|---|
| 3,989,385 | 11/1976 | Dill et al. | 356/152 |
| 4,090,068 | 5/1978 | Widmann et al. | 356/152 |
| 4,328,553 | 5/1982 | Fredriksen et al. | 356/152 |
| 4,353,087 | 10/1982 | Berry et al. | 356/152 |
| 4,357,100 | 11/1982 | Mayer et al. | 356/152 |
| 4,444,492 | 4/1984 | Lee | 356/152 |
| 4,496,241 | 1/1985 | Mayer | 356/152 |
| 4,585,337 | 4/1986 | Phillips | 356/152 |

Primary Examiner—Stephen C. Buczinski
Assistant Examiner—Melissa L. Koltak
Attorney, Agent, or Firm—Antonelli, Terry & Wands

[57] ABSTRACT

A semiconductor focusing exposure apparatus in which an opposite face of a mask to a face to be illuminated by exposure light is illuminated with alignment light so that the light reflected from said opposite face may be used for alignment and which is equipped with a second moving arrangement which is separate from a moving arrangement for an x-y moving table supporting a wafer, for aligning the mask and the wafer in an orthogonal direction with respect to the optical axis of a focusing lens.

Moreover, the center of the flux of alignment pattern light for illuminating the wafer is made incident upon a line of intersection on which a plane containing the optical axis of an alignment optical system and the optical axis of said focusing lens and the incident plane of said focusing lens intersect with each other.

Still moreover, the optical path of the alignment light beam is aligned in parallel with a straight line joining an alignment mark formed on the diffraction pattern and the center of the entrance pupil of said focusing lens.

12 Claims, 26 Drawing Figures

(a)

(b)

(c)

FIG. 25
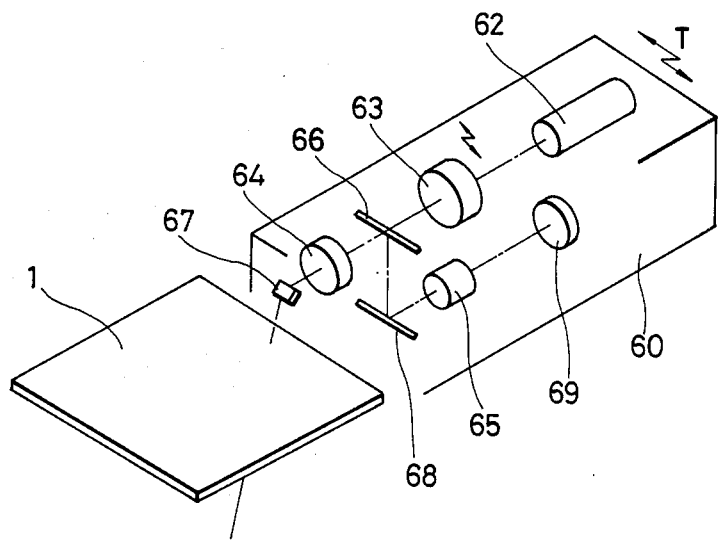
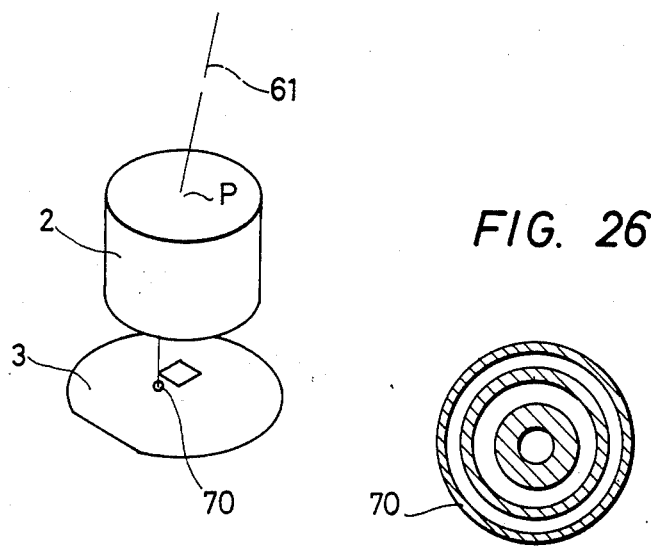
FIG. 26

SEMICONDUCTOR EXPOSURE APPARATUS AND ALIGNMENT METHOD THEREFOR

BACKGROUND OF THE INVENTION

The present invention relates to a semiconductor exposure apparatus for exposing a wafer to the pattern of a mask and, more particularly, to a semiconductor exposure apparatus which is enabled to achieve an exposure, while being freed from complicated processes for changes in the chip size of said wafer or for advancement of the exposure process, always in the exposure position, i.e., without any movement of said wafer after the wafer and the mask have been aligned.

When a semiconductor is to be exposed to a pattern, according to the prior art, the alignment between the mask and the wafer is conducted either by a method such as the off-axis alignment method, using an alignment optical system other than an exposure focusing lens or by a method such as the TTL alignment method, using an exposure focusing lens. The former method is performed by measuring several positions of the peripheral chip on a wafer by means of an alignment optical system and a laser length meter, by computing the chip exposure position on the wafer on the premise that the other chips are accurately arrayed and that the relative positions on the optical axes of the exposure focusing lens and the alignment optical system are accurately known, by moving the chips on the wafer to the computed positions, and by exposing them successively by a stp and repeat method. This method may suffice to measure the several positions of the chips such that the time period required for the chip alignment occupies a short duration in the time period required for exposing all of the wafer but it fails to accurately aligning each chip with the mask. This may raise a serious problem in the future when the exposure pattern becomes finer and finer so that a more accurate alignment is required. The latter method of the prior art for conducting the alignment for each chip by means of the exposure focusing lens is divided into several methods. One example of these methods is shown in FIG. 1. In the example of FIG. 1, a mask 1 has its exposure circuit pattern 4 and alignment marks 112 and 112' are displaced on its face so that an alignment optical system and an exposure optical system do not interfere with each other when the alignment and the exposure are to be executed. For this purpose, as shown in FIG. 2, the alignment between the mask and the chip of the wafer is conducted by aligning the chip alignment marks 122' (and 122) of the wafer and the alignment images 112' (and 112) twice in the order of FIGS. 2(a) and (b), by reading out the wafer position in x and y directions by means of laser length meters LM (and LM'), and by exposing a chip 21 to the image 4' of the circuit pattern of the mask, as shown in FIG. 2(c)-, on the basis of the data read out. In FIG. 1, reference numerals 160, 161 and 161' indicate members for detecting the position of said wafer. As compares with the off-axis alignment method, the TTL alignment method of the prior art herein after called a first alignment moving means has a superior alignment accuracy but has to shift the position of the wafer for execution of the alignment and for the exposure so that the error in the measurement of the laser length meter leads to reduction in the alignment accuracy. There arises another problem in that the time period required for exposing the whole wafer is elongated.

The prior art is exemplified by Japanese Patent Laid-Open Nos. 52-109875, 55-108743, 57-142612 or 58-112330, Japanese Application Nos. 58-243866 and 58-219415 and U.S. Pat. Application Ser. No. 684,292.

SUMMARY OF THE INVENTION

An object of the present invention is to provide a semiconductor exposure apparatus to solve the aforementioned problems of the prior art by making use of an exposure focusing lens, to expose the whole wafer for a short time period instantly in the position where the alignment has been conducted, and to ensure the alignment in the exposure position even for changes in the size of the circuit pattern.

In order to achieve the above-specified object, according to the present invention, a semiconductor exposure apparatus comprising: a focusing lens for focusing a pattern of a mask on a wafer; an illuminating system for exposing the wafer to the mask pattern and illuminating the wafer; and alignment means, equipped with a money mechanism for detecting directly or indirectly the relative positions of an alignment mark on the mask and an alignment mark on the wafer herein after called a second alignment moving means, which is composed of an optical system and a detecting element for detecting the image of the wafer or the images of the wafer and the mask and which are in a fixed positional relationship, in a tangential direction with respect to the optical axis of said focusing lens. The moving mechanism is used for the second alignment moving means as a whole when the chip size is changed or when the superposed exposure process advances so that the alignment is to be conducted by making use of a new wafer alignment mark. When a circuit having a different chip size is to be exposed, the alignment means is brought as a whole toward or apart from the optical axis of the focusing lens so that the alignment mark disposed in the vicinity of the circuit periphery may be aligned (in the y direction when the alignment marks 112 and 122 are used in FIG. 1). When one circuit is to be fabricated, the mark patterns are successively repeated for repeated superposed exposures, whereupon the position of the new alignment mark is generally moved in the x direction, as viewed in FIG. 1 (when the alignment marks 112 and 122 are used). After this movement of the alignment means has been conducted, the alignment means is not moved but fixed, and the alignment is executed in the state of the relative positions of the mask and the wafer when the wafer is exposed to the mask. A method of conducting the alignment in that exposure position has already been applied for patent by the present inventors, as is disclosed in Japanese Patent Applications Nos. 58-243866 and 58-219415. The inventions of the above-specified Applications have already been applied for U.S.A. patent (now bearing U.S. patent application Ser. No. 684,292) on Dec. 20, 1984.

Another object of the present invention is to solve the problem of the displacement of the image of an alignment mark on a wafer, which is caused by chromatic aberration when light having a wavelength different from the light for the exposure is used as the light having the wavelength necessary for the alignment in the aforementioned apparatus for the alignment in the exposure position. For this solution, the present invention is characterized by forming the alignment mark on the mask of a later-described diffraction pattern so that the optical path of the light beam coming from an alignment optical system for illuminating said alignment mark formed of the diffraction pattern may be aligned parallel with a straight line joining the diffraction pattern and the center of the entrance pupil of the focusing lens.

Still another object of the present invention is to correct the misalignment which is caused when the detected position of the wafer fluctuates in a vertical (or z) direction with respect to the wafer face, as will be described hereinafter, in the aforementioned apparatus for the alignment in the exposure position. For this solution, the present invention is characterized by making the center of the flux of the alignment light for illuminating the alignment pattern of said wafer incident upon a line of intersection on which a plane containing the optical axis of the alignment optical system and the optical axis of the focusing lens and the entrance pupil plane of said focusing lens intersect with each other.

BRIEF DESCRIPTION OF THE DRAWINGS

FIG. 25 is a perspective view showing the alignment optical system using a Fresnel zone alignment, and FIG. 26 is a view showing a Fresnel zone alignment mark.

DESCRIPTION OF THE PREFERRED EMBODIMENTS

Figure 1:
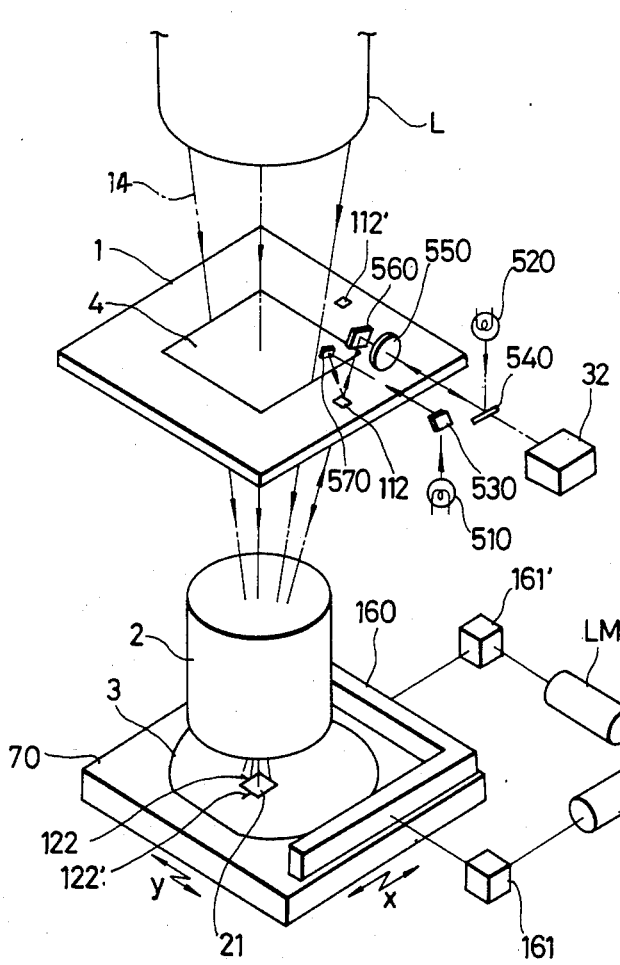
FIG. 1 is a perspective view showing the construction of the semiconductor exposure apparatus of the prior art.
Figure 2:
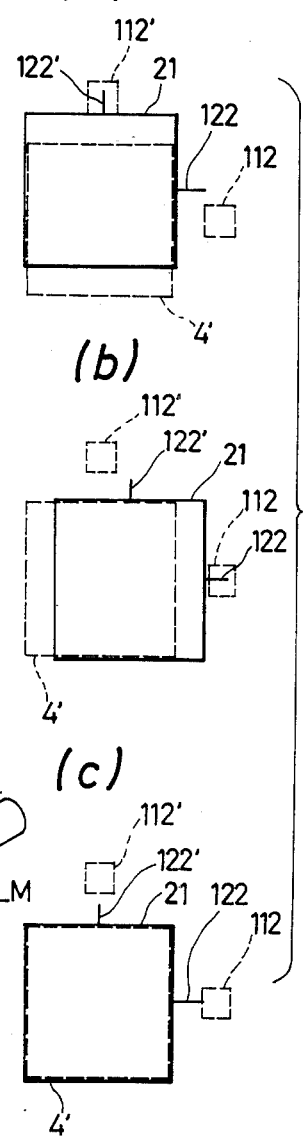
FIG. 2 is a view showing the alignment state in the apparatus shown in FIG. 1.
Figure 4:
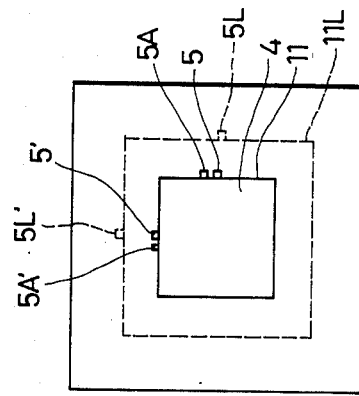
FIG. 4 is a top plan view showing the mask in the apparatus shown in FIG. 3.
Figure 3:
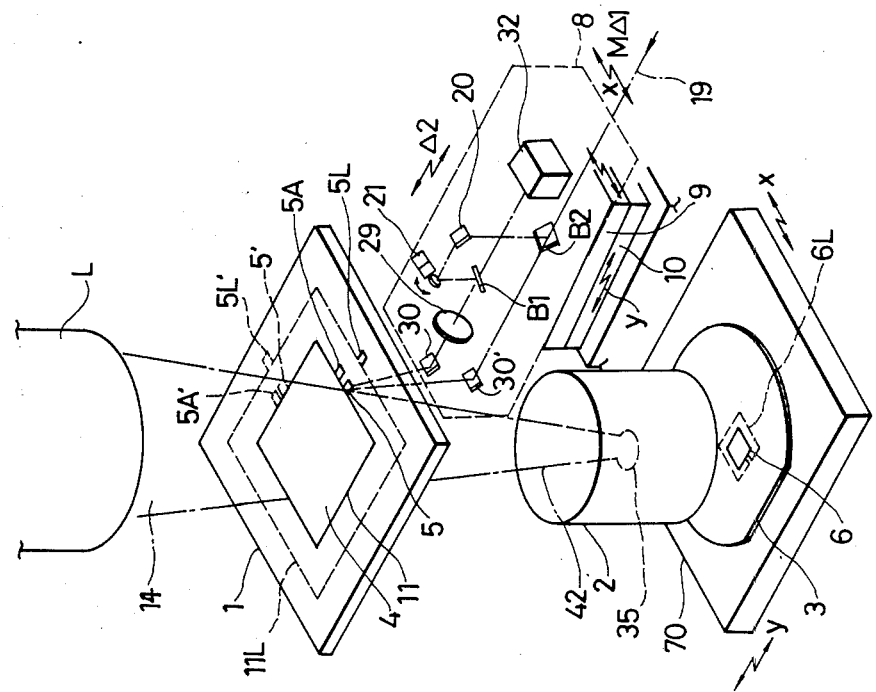
FIG. 3 is a perspective view showing one embodiment of the semiconductor exposure apparatus of the present invention.
Figure 14:
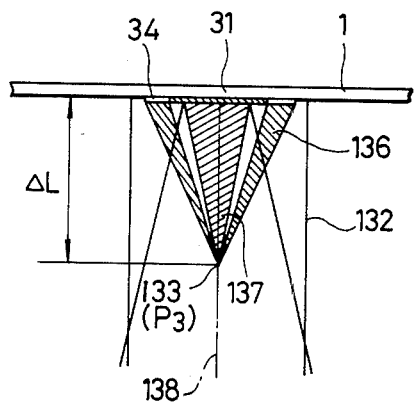
FIG. 14 is a side elevation taken in the direction of arrow R from FIG. 11 when the movement of the alignment optical system in the tangential direction is zero (i.e., when the chromatic aberration of the focusing lens is zero)

One embodiment of the present invention will be described in the following with reference to FIGS. 3 to 5. A mask 1 has its circuit pattern 4 focused in a reduced scale onto a wafer 3 lying on a wafer X-Y table 70, by the action of a focusing lens 2. For this exposure, illuminating light 14 is emitted by an exposure illuminating system L so that light 42 having transmitted through the circuit pattern on the mask and having been diffracted is incident upon an entrance pupil 35 of the focusing lens. In order that the circuit forming its image on the wafer may be focused in high resolution on the wafer, the construction has to be made such that an alignment optical system may not come into the outermost periphery of the envelope which is formed by (a number of) lines joining the periphery of the entrance pupil 35 of the focusing lens and the periphery 11 of the circuit pattern portion. In the prior art, therefore, the alignment mark 112 of the mask is disposed apart from the circuit portion 4, as shown in FIG. 1, so that the alignment cannot be made in the exposure position. In the present embodiment, the alignment mark of the mask is formed, as shown in FIGS. 3 and 4, with the later-described mask alignment of pattern shape shown in FIG. 8 adjacent to the periphery 11 of the circuit portion 4. This target is formed at its central portion with a mirror surface 31 and at its two sides with hyperbolic patterns or quasi-hyperbolic patterns 34 as shown in FIG. 14. Moreover, the corresponding position of the alignment mark on the wafer provides the so-called "scribe area" at the boundary between the chips shown in FIG. 3. The wafer is already recorded thereon in the scribe area with an alignment mark 7 having a width of about 6 microns and having its longitudinal direction directed generally toward the circuit center. The detection of the wafer pattern is conducted by means of the laser beam which is emitted from alignment detecting means 8 and incident upon the aforementioned mirror surface 31 on the mask so that its reflected beam illuminates the wafer alignment mark 7 through the focusing lens. This laser beam 19 is guided from the outside of the alignment detecting means and is reflected by a beam splitter B2 and a mirror 20 and then it is swung by a galvano mirror 21. This swing method defined herein is means for improving the S/N ratio of the alignment detection. The swing method is disclosed in detail in the above-specified Japanese Patent Application No. 58-243866 and U.S. patent application Ser. No. 684,292, which were already filed by the present Inventors, and its detail is omitted here because it is not especially necessary here. The laser beam swung by the galvano mirror 21 transmits through a beam splitter B1 and a mirror 30 and is reflected by the aforementioned mirror surface 5 on the mask to illuminate the wafer alignment mark while having its angle of incidence changed. The laser beam reflected by the wafer reverses its initial optical path to transmit through the beam splitter B1 until it is detected by a solid array sensor 32. If the laser beam traces that path, the alignment detecting means can be arranged without shielding the exposure light for printing the circuit pattern so that the wafer alignment mark can be detected in the exposure position.

Figure 6:
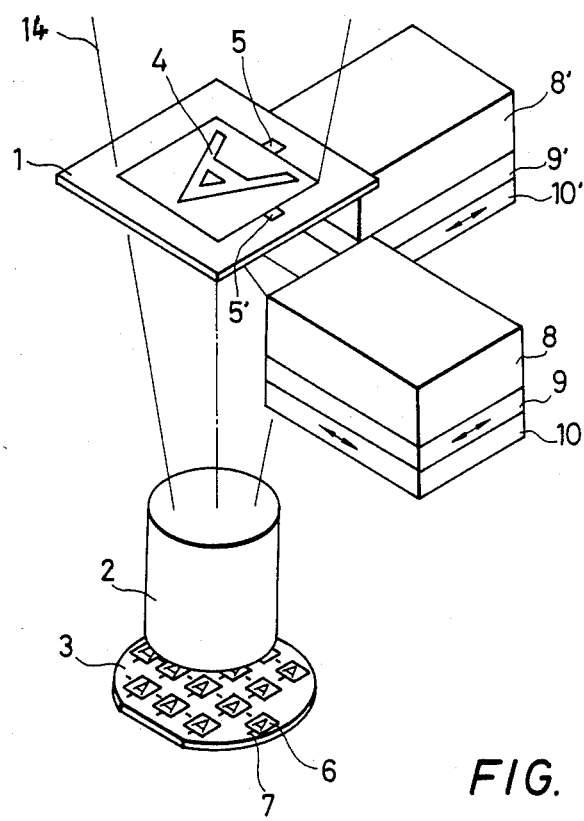
FIG. 6 is a perspective view showing an exposure apparatus of the present invention.
Figure 7:
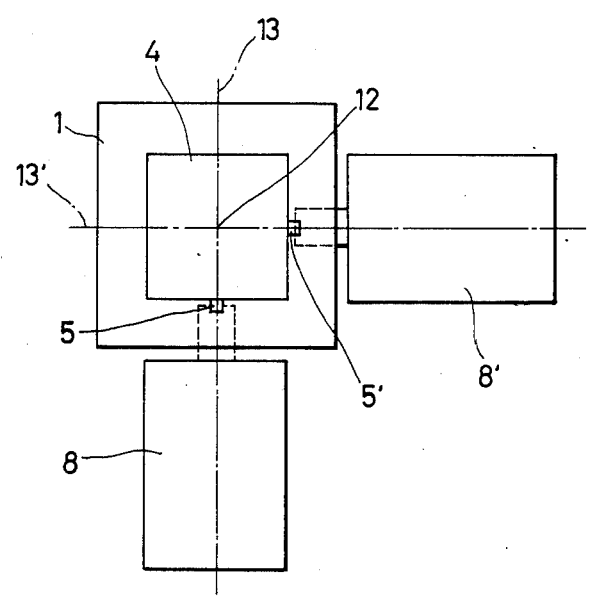
FIGS. 7 and 8 are top plan views showing the relationship between a mask and an alignment optical system in the apparatus shown in FIG. 6.

FIGS. 6 and 7 are views schematically showing the major portion of FIG. 3 and the example structure which is equipped with two sets of stages for moving the alignment optical system. The summary of the moving stages will be described in the following so as to further the understanding of the structure of FIG. 3.

First of all, as shown in FIG. 6, when the circuit pattern 4 on the mask 1 is guided onto the wafer 3 through the focusing lens 2 by the step and repeat method so as to effect the exposure chip by chip (for each exposure region), it is necessary to align the pattern 4 of the mask and a pattern 6 on the wafer 3. For this necessity, the alignment is conducted with the alignment mark 5 on the mask and the alignment mark 7 on the wafer by means of alignment optical systems 8 and 8'. Reference numeral 14 indicated exposure light. The aforementioned alignment optical system 8 and, 8' are carried on stages 9 and 9' for moving the alignment optical system 8 and 8' in a orthogonal (T) direction and on stages 10 and 10' for moving the same in a radial (R) direction which means a tangential direction with respect to said orthogonal direction. FIG. 7 shows the case in which the optical axis planes of the alignment optical systems 8 and 8' are positioned in normal planes 13 and 13' joining the optical axis 12 of the focusing lens.

Figure 5:
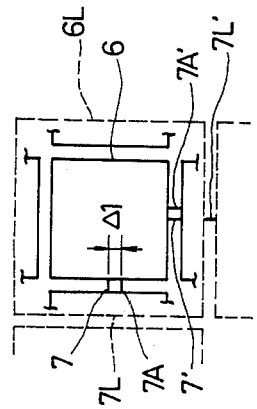
FIG. 5 is a top plan view showing the exposure region on a wafer in the apparatus shown in FIG. 3.

In the aforementioned embodiment shown in FIGS. 3 to 5, the chips on the wafer are exposed in a superposed manner successively to different patterns by replacing the masks. If, in this case, an identical alignment mark on the wafer is used for each exposure, the pattern is degraded so that the alignment accuracy is reduced. As the superposed exposure process advances, therefore, it becomes necessary to use a new wafer alignment mark. This new wafer alignment mark is exemplified by wafer alignment marks 7A and 7A' shown in FIG. 5. These marks are positioned adjacent, at a distance $\Delta_1$, to the alignment marks 7 and 7' which have been used for the previous exposures. The symbol $\Delta_1$ indicates 100 to 200 microns, for example, on the wafer. In order to detect those new alignment marks, in the present invention, the alignment detecting means is moved in its entirety such a distance (e.g., $M\Delta_1$ if the magnification of the lens is indicated at M) on the mask as corresponds to that distance $\Delta_1$. This movement is conducted by using the alignment detecting means moving mechanism 9. The alignment mark of the mask to be used when a new circuit pattern is exposed by using the new wafer alignment mark 7 is indicated at 5A in FIGS. 3 and 4. Since the alignment detecting means is moved the distance $M\Delta_1$ in the x direction, i.e., in the orthogonal direction with respect to the optical axis of the focusing lens 2, it is possible to align the wafer and the mask absolutely like the aforementioned alignment by making use of the mask alignment mark 5A which is displaced the distance $M\Delta_1$ from 5.

Next, the following description is directed to the case in which the external size (i.e., the chip size) of the circuit pattern is changed in the present embodiment. If the external shape of the chip is changed from 6 to 6L, as shown in FIGS. 3 and 5, the external shape of the circuit portion of the mask is also changed from 11 to 11L. In accordance with this change, the mask alignment mark is also moved from 5 to 5L. In order to conduct the alignment in the exposure position by making use of that target mark 5L, in the embodiment of the present invention, the whole alignment detecting means is moved, as shown in FIG. 3, a distance $\Delta_2$ in a y direction, i.e., in the radial direction with respect to the optical axis of the focusing lens 2 by the moving mechanism thereof. Then, the alignment of the alignment marks 7 and 5 can be made in the exposure position absolutely like the aforementioned method.

Figure 8:
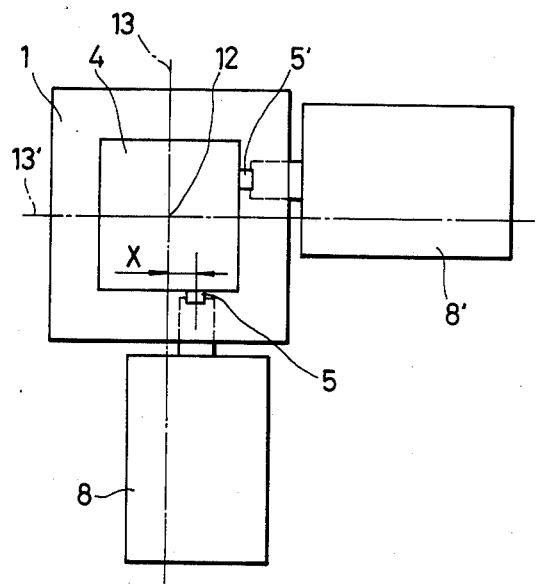
Figure 9:
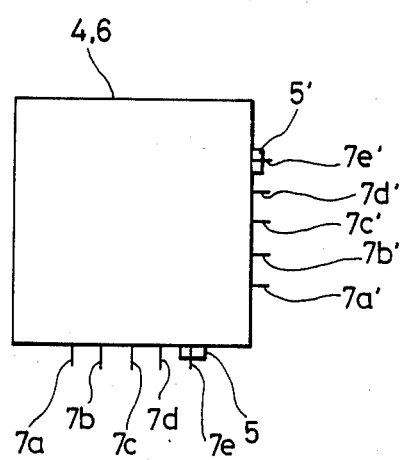
FIG. 9 is a top plan view showing the relationship between a pattern on the mask and a pattern on a wafer.
Figure 10:
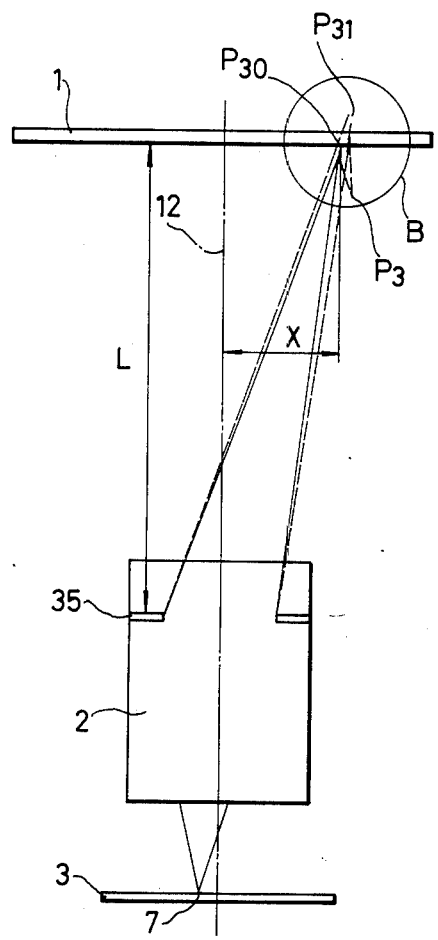
FIG. 10 is an explanatory view showing the position in which the image of the alignment mark of the wafer is formed due to the chromatic aberration of a hyperbolic pattern portion.

In a highly integrated semiconductor resist, there are used a resist containing a material for absorbing light of the same wavelength as that of the exposure light and a multi-layered resist. In order to ensure the alignment in the same position as the exposure position, in the present invention, the light used for the alignment has a wavelength different from that of the aforementioned exposure light. If the alignment optical systems 8 and 8' are moved for the alignment a distance X, as shown in FIG. 8, by making use of the light having a wavelength different from that of the exposure light, the image $P_{31}$ of the alignment mark 7 on the aforementioned wafer 3 is displaced by the aforementioned influences of the chromatic aberration of the focusing lens from the image position $P_{30}$, as shown in FIG. 10, so that it leaves the mask. As a result, if the alignment optical systems 8 and 8' are disposed below the mask 1, as shown in FIG. 6, the image $P_3$ formed by the reflection on the face of the mask 1 is to be aligned. Here, if the aforementioned alignment optical systems 8 and 8' are arranged such that the distance taken in the tangential direction of the aforementioned focusing lens 2 is designated at X, as shown in FIG. 10, such that the distance from the mask 1 to the entrance pupil 35 disposed in the focusing lens 2 is designated at L, and such that the chromatic aberration of the focusing lens 2 is designated at $\Delta L$, the alignment marks 7 and 7' on the wafer 3 are subjected to such a displacement $\Delta X$ by the chromatic aberration of the focusing lens 2 as is expressed by the following equation.

$$\Delta X \frac{X}{\Delta} \cdot \Delta L$$

In order to effect the alignment while neglecting the aforementioned displacement $\Delta X$ of the alignment mark 7 on the wafer 3, the present invention is characterized by forming a diffraction pattern on the mask 1 in place of the aforementioned alignment marks 5 and 5' of the mask 1, forming the diffracted image of the diffraction pattern in the position of the image $P_3$ formed by the reflection on the mask 1, and by moving the alignment optical systems 8 and 8' to align the focal point of the light with the position of that image $P_3$ so that the images of the alignment marks 7 and 7' on the wafer 3 may be aligned with the alignment marks 5 and 5' of the mask 1.

Figure 12:
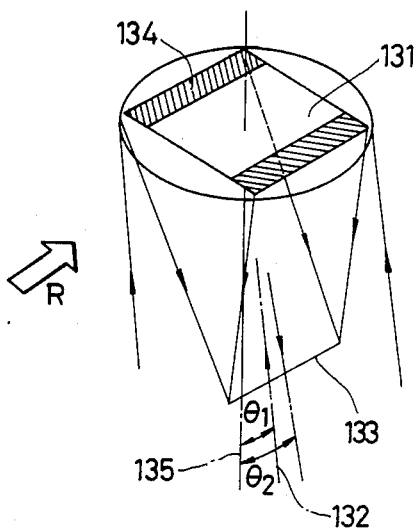
FIG. 12 is a perspective view showing the positional relationship between the mask and the alignment mark.

The present invention will be described in the following in connection with the embodiments thereof with reference to the accompanying drawings. In order to reflect the aforementioned images of the alignment marks 7 and 7' on the wafer 3, the alignment marks 5 and 5' on the mask 1 are formed, as shown in FIG. 12, a mirror portion 131 and a hyperbolic pattern portion 134 adjacent to that mirror portion 131. The latter hyperbolic pattern portion 134 is formed of a group of hyperbolic or quasihyperbolic lines.

Figure 11:
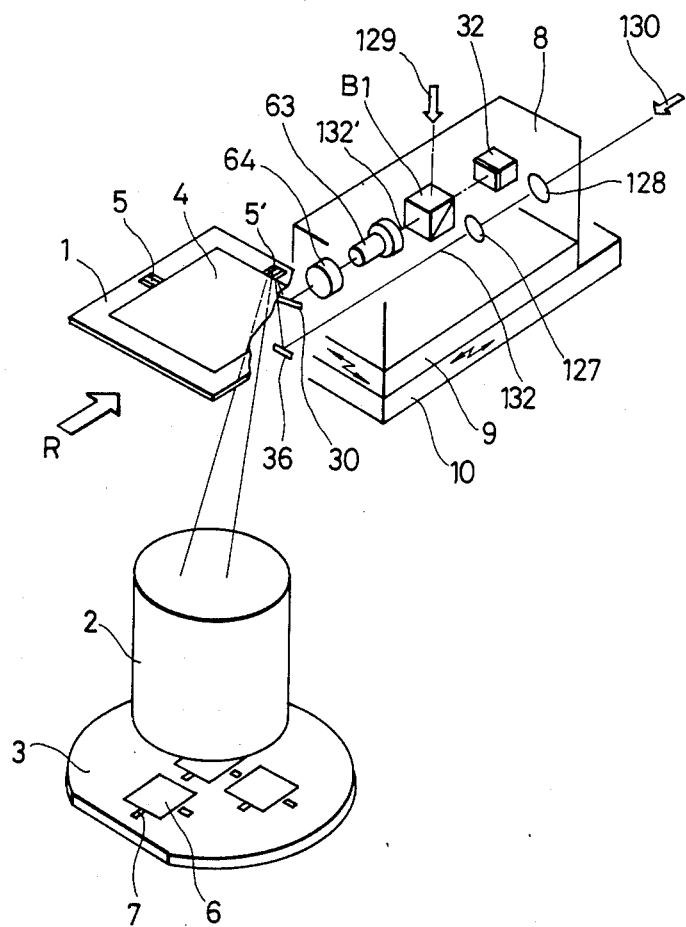
FIG. 11 is a perspective view showing the alignment optical system.
Figure 13:
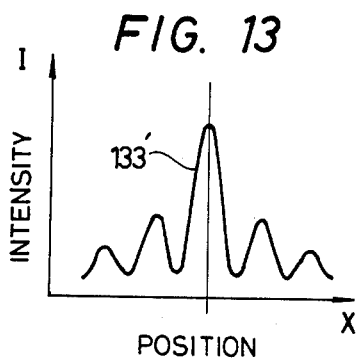
FIG. 13 is a diagram showing the sectional optical intensity distribution of a diffracted image by the hyperbolic pattern portion.
Figure 15:
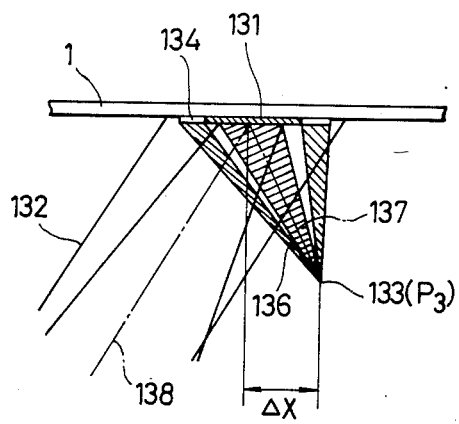
FIG. 15 is a side elevation taken in the direction of the arrow R from FIG. 11 when chromatic aberration of the focusing lens occurs.
Figure 16:
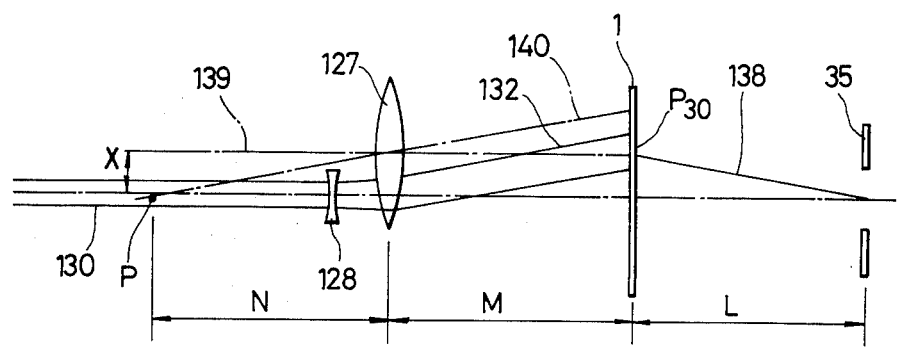
FIG. 16 is a diagram of the alignment optical system for the mask shown in FIG. 11.

FIG. 11 shows the construction of the alignment optical system 8. First of all, if a light beam 132' in the direction of arrow 129 illuminates the aforementioned mirror portion 131 shown in FIG. 12 through the beam splitter B1, an enlarging lens 63, a relay lens 64 and the mirror 30, the images of the alignment marks 7 and 7' on the wafer 3, which are formed in the position indicated at $P_3$ in FIG. 10, are detected by the sensor 32 through the aforementioned mirror 30, relay lens 64, enlarging lens 63 and beam splitter B1. If a light beam 132 indicated by arrow 130 comes in parallel with the aforementioned light beam 132' to illuminate the hyperbolic pattern portion 134 (See FIG. 12) on the mask 1 through a concave lens 128, a convex lens 127 and a mirror 36, it is diffracted by that hyperbolic pattern portion 134 to form a linear diffracted image 133 in a position indicated at $P_3$ in FIG. 12. The optical intensity section 133' of the diffracted image at this time has such a distribution as is shown in FIG. 13. Thus, when the distance X shown in FIG. 10 is zero, the images of the alignment marks 7 and 7' of the wafer 3 are reflected by the mirror portion 131 on the mask 1 and focused at the position $P_3$, as shown in FIG. 14. The images of the alignment marks 7 and 7' of the wafer 3 formed at that position $P_3$ are formed on that center line 138 of a light flux 137, which extends on the center line of the entrance pupil 35 formed in the focusing lens 2. As a result, if the aforementioned illumination light 132 illuminated on the hyperbolic pattern portion 134 on the mask 1 and coming from the alignment optical systems 8 and 8' is directed in parallel with the aforementioned center line 138 of the light flux 137, the image 133, which is formed as a result that the light beam 132 from the alignment optical systems 8 and 8' is diffracted by the hyperbolic pattern portion 134, can be superposed generally on the images of the alignment marks 7 and 7' of the wafer 3, which are formed in the position $P_3$. In case the aforementioned distance X is large, as shown in FIG. 15, on the other hand, the aforementioned images of the alignment marks 7 and 7' of the wafer 3 are formed in the position $P_3$ which is displaced by $\Delta X$ of the extension when the center line 138 of the light flux 137 is reflected on the mirror portion 131. If, therefore, the light beam 132 illuminating the hyperbolic pattern portion 134 of the mask 1 and coming from the alignment optical systems 8 and 8' is directed in parallel with the center line 138 of the light flux 137 like the foregoing case, the image 133, which is formed as a result that the aforementioned light beam 132 of the alignment optical systems 8 and 8' is diffracted, as indicated at 136, by the hyperbolic pattern portion 134, can be superposed upon the alignment marks 7 and 7' of the wafer 3, which are formed in the position $P_3$, so that it can be detected in the same field of view as that of the alignment optical systems 8 and 8'. Thus, the direction of the aforementioned light beam 132 from the alignment optical systems 8 and 8' in parallel with the center line 138 of the light flux 137 is effected, as shown in FIGS. 11, 12 and 16, by first making the light beam, which comes from the alignment optical systems 8 and 8' to illuminate the hyperbolic pattern portion 134 on the mask 1 in the direction 132 and by then fixing it with respect to the focusing lens 2 so that the light beam 132 may take a relationship to transmit substantially to the center of the focusing lens 2. Moreover, a concave lens shown in FIG. 16 is fixed on the radially moving stage 10 so that the aforementioned light beam 132 may become independent of the aforementioned orthogonal movement of the alignment optical systems 8 and 8' with respect to the focusing lens 2. The aforementioned light beam 132 forms a virtual condensation P at a point P which is spaced a focal length from the concave lens 128. If one convex lens 127 is placed on the orthohgonal moving stages 9 and 9', it is displaced the distance X from the illuminating light 132 accordingly as the alignment optical systems 8 and 8' are displaced the distance X in the orthogonal direction with respect to the focusing lens 2. Here, if the focal length of the aforementioned convex lens 127 is designated at N and if the convex lens 127 is positioned at a spacing of the distance N from the aforementioned point P, the light beam emanating from the convex lens 127 transmits in parallel with a straight line 140 joining the center of said convex lens 127 and the point P. Since the images of the alignment marks 7 and 7' of the wafer 3 are located on the straight line joining the center point $P_{30}$ (which should be referred to FIG. 10) of the mirror 131 on the mask 1 and the center of the incident eye 35 of the focusing lens 2, the inclination of that light with respect to the mask 1 is expressed by X/L if the distance between the mask and the incident eye 35 of the focusing lens 2 is designated by L. In order to make the aforementioned light beam 132 have the inclination X/L, N=L has to hold because X/N=X/L. In order to align the center of the light beam 132 with the aforementioned center point $P_{30}$ of the mirror portion 131 on the mask 1, moreover, M=L has to hold if the distance between the convex lens 127 and the mask 1 is designated as M. Thus, the aforementioned diffracted image 133 formed by the hyperbolic pattern portion 134 on the mask 1 can be aligned generally with the position $P_3$ in which the images of the alignment marks 7 and 7' of the wafer 3 are to be formed.

Incidentally, it is conceivable that a small displacement between the images of the alignment marks 7 and 7' of the wafer and the image 133 diffracted at 136 by the hyperbolic pattern portion 134 of the mask 1 may be caused by the errors of the lenses 64 and 63, the convex lens 127 and the convex lens 128 arranged in the aforementioned alignment optical systems 8 and 8'. This displacement can be corrected in advance as the offset intrinsic to the alignment by means of software. On the other hand, the method of forming the aforementioned images of the alignment marks 7 and 7' of the wafer 3 by the diffraction can be exemplified by using a two-dimensional Fresnel zone alignment or the like.

As has been described hereinbefore, according to the present invention, there can be attained the result that the alignment optical systems can be moved either in the orthogonal direction or in the radial direction with respect to the focusing lens, and that the alignment between the mask of the semiconductor exposure apparatus and the pattern of the wafer can be made very accurate, even when the aforementioned alignment optical systems are moved.

Next, another embodiment of the present invention will be described in the following in connection with the aforementioned focusing displacement due to the chromatic aberration. It is desired that a resist applied to the wafer be insensitive to the laser beam used for detecting the alignment of the wafer alignment pattern. To achieve this, the laser beam used has a wavelength of about 500 nm or longer. As a result, the focusing lens generates chromatic aberration (in the direction of the optical axis) when exposed to that light.

Figure 17:
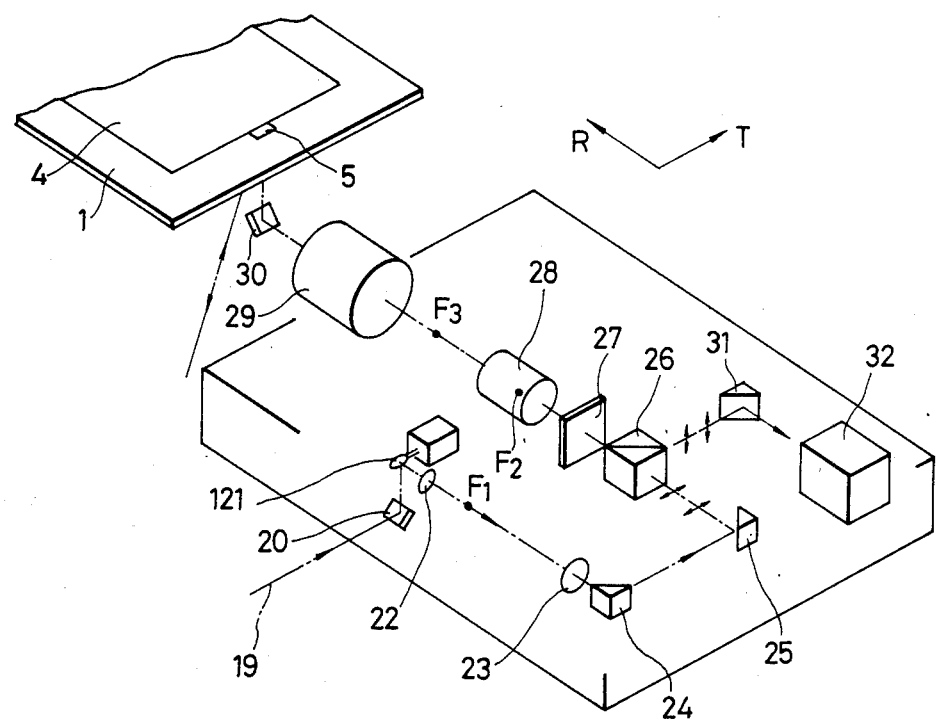
FIG. 17 is a perspective view showing the construction of the alignment optical system.
Figure 18:
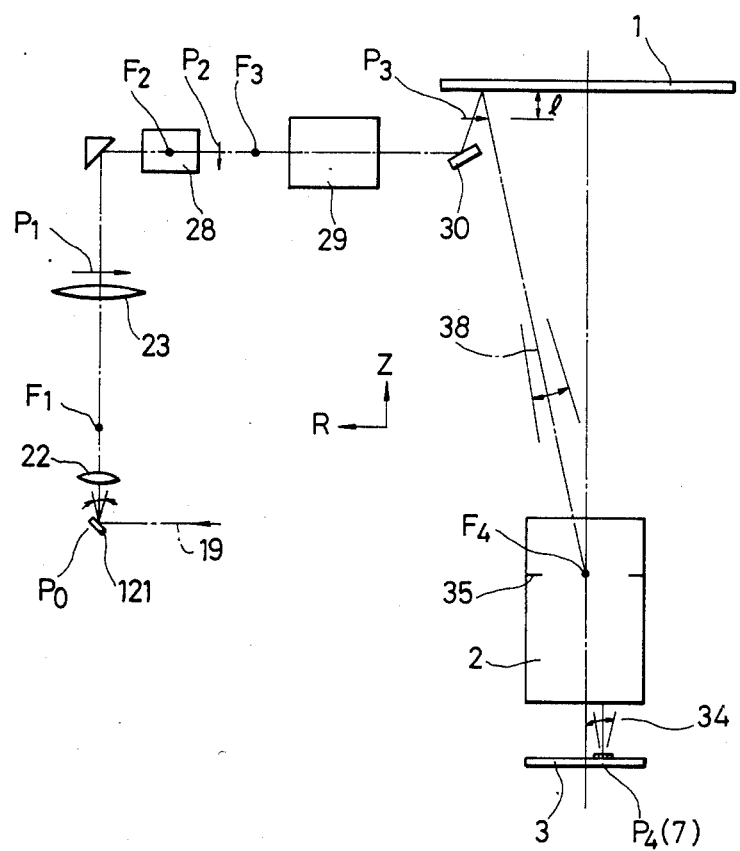
FIG. 18 is a diagram showing the optical path of the alignment optical system.

FIGS. 17 and 18 show the construction of the alignment optical system and one example of the fundamental optical path thereof.

The laser beam 19 is used for illuminating the wafer. The beam having passed through the mirror 20 is swung by a galvano mirror 121. The beam having been converged to a position $F_1$ by a lens 22 is converged again to a position $F_2$ in a lens 28 through a lens 23, mirrors 24 and 25, a polarizing beam splitter 26 and a $\lambda/4$ plate 27. Moreover, the beam passes through a lens 29, the mirror 30 and the mask 1 until it is converged to a plane $F_4$ of the incident eye 35 of the focusing lens 2. As a result, a parallel beam illuminates a point $P_4$ (or the alignment mark 7) on the wafer 3. The conjugate points of the position $P_0$ of the galvano mirror 121 are $P_1$, $P_2$, $P_3$ and $P_0$ so that the plane $F_4$ is swung (by the aforementioned swing method), as indicated at 33, whereas the position $P_4$ is swung, as indicated at 34.

The image of the alignment mark of the wafer 3 is then focused on the sensor 32 through the mask 1, the mirror 30, the lenses 29 and 28, the $\lambda/4$ plate 27 and the polarizing beam splitter 26 by way of the mirror 31. The position of the sensor 32 corresponds to the conjugate point of the point $P_1$ of FIG. 18. In order to enhance the optical efficiency, incidentally, the incident light is subjected to a P-polarization to transmit straight through the polarizing beam splitter 26, whereas the return light is subjected to an S-polarization and is reflected.

In case a light having a wavelength different from that of the exposure light is used for the alignment, the position of the point $P_3$ is spaced a distance l from the mask 1 (as shown in FIG. 18), because the chromatic aberration of the focusing lens 2 occurs.

Figure 19:
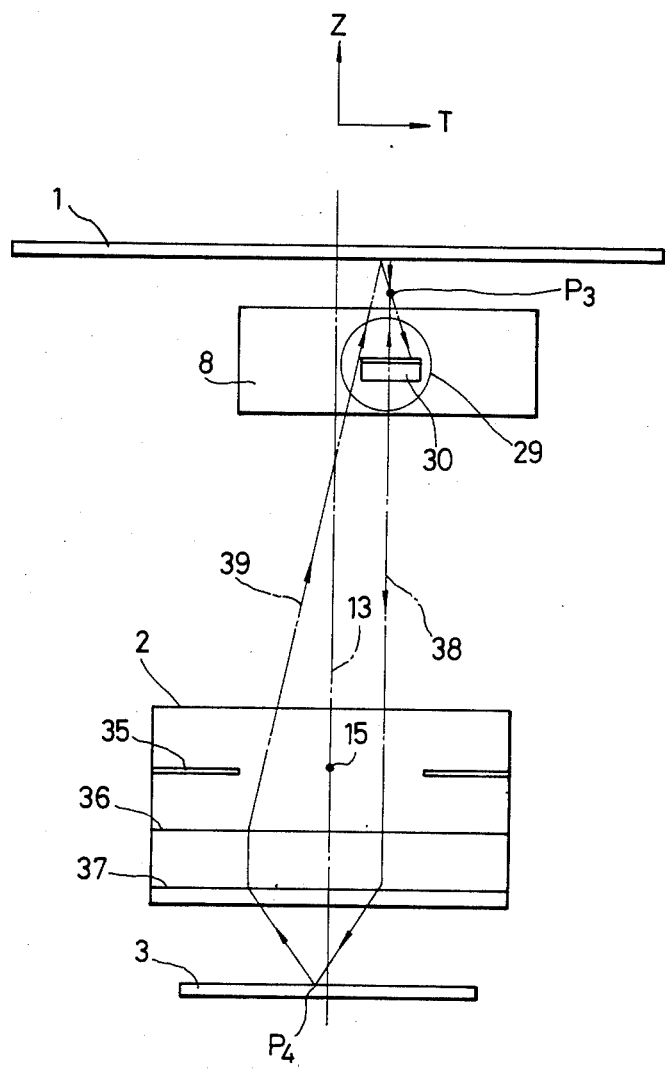
FIGS. 19 and 22 are front elevations showing the alignment optical system.

Now, in the optical system of FIG. 18, the wafer illuminating light is swung in the radial direction of the focusing lens 2 but is left as a thin beam in the orthogonal direction. FIG. 19 is a front elevation showing the alignment optical system, i.e., the sectional state taken in the orthogonal direction from the focusing lens. A light flux 38 emanating from the alignment optical system 8 through the lens 29 and the mirror 30 illuminates the wafer at the position $P_4$ through the focusing lens 2. Since, however, the flux 38 of the alignment light beam fails to pass not only through a line 15 of intersection, on which the plane 13 containing the optical axis of the entrance pupil of the focusing lens 2 and the optical axis of the alignment optical system, i.e., the plane extending downward of the Drawing sheet in the front view intersects the entrance pupil plane 35, but also through a line directed downward of the Drawing sheet in the front view, it is inclined with respect to the wafer so that the center of the flux of the return light passes through a path 39 and is superposed at the point $P_3$ on the center of the flux 38 of the illuminating light to form the wafer image at the intersecting point until it is incident at an inclination upon the alignment optical system 8.

Figure 20:
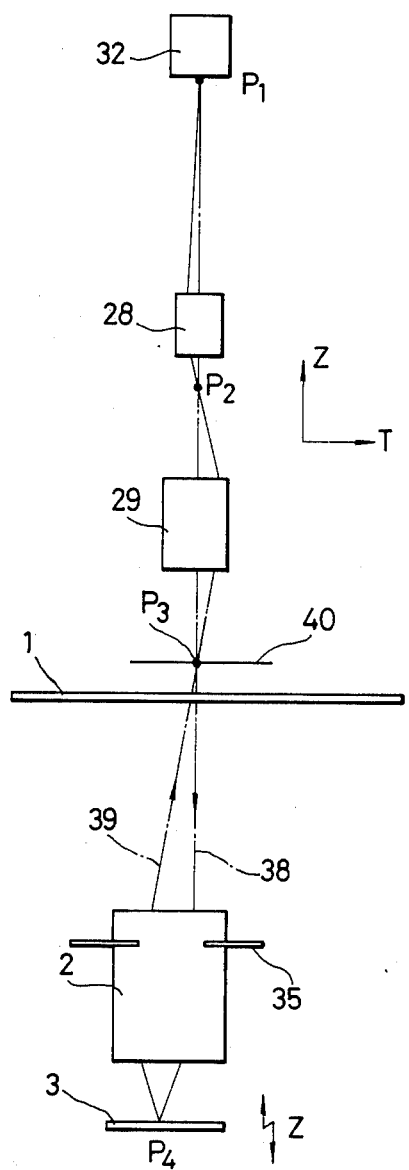
FIG. 20 is a diagram showing the alignment optical path viewed in a front elevation.

FIG. 20 is an expansion of a portion of the alignment optical system 8 of FIG. 19. The system from the sensor 32 to the conjugate plane 40 of the alignment optical system is fixed. As a result, when the wafer 3 fluctuates in a Z direction, the image $P_3$ of the wafer does not always come to the conjugate plane 40 of the sensor.

Figure 21:
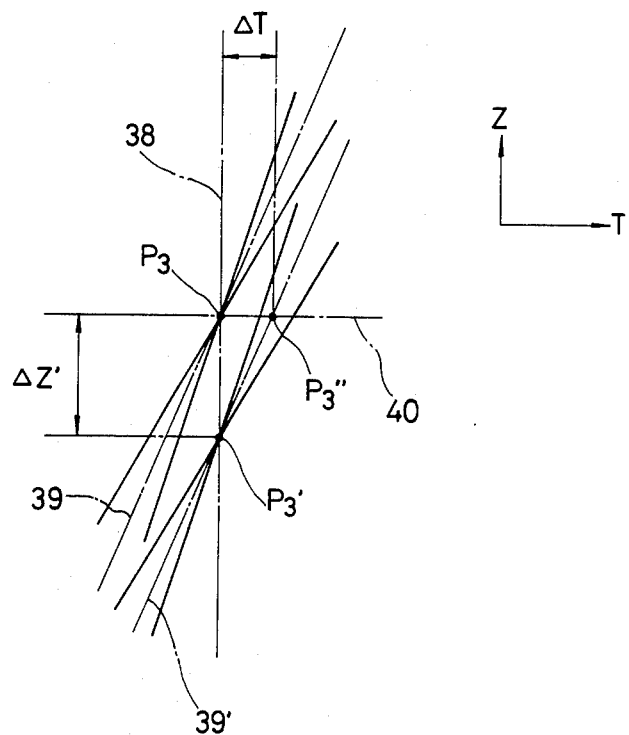
FIGS. 21 and 23 are enlarged diagrams showing the vicinity of a point $P_3$.

FIG. 21 enlarges the behavior in the vicinity of the point $P_3$ when the wafer fluctuates in the Z direction. The point $P_3$ is in the conjugate plane 40, when the wafer is positioned, as designed, but comes to a position $P'_3$ with a displacement $\Delta Z'$ when the wafer fluctuates in the Z direction. At this timer, the sensor detects a spot position $P_3''$ on its conjugate plane 40 so that an alignment error $\Delta T$ is caused.

In order to eliminate this alignment error, it is necessary to hold the spot across over the conjugate plane 40 of the sensor always in a fixed position irrespective of the movement of the wafer in the Z direction.

Figure 22:
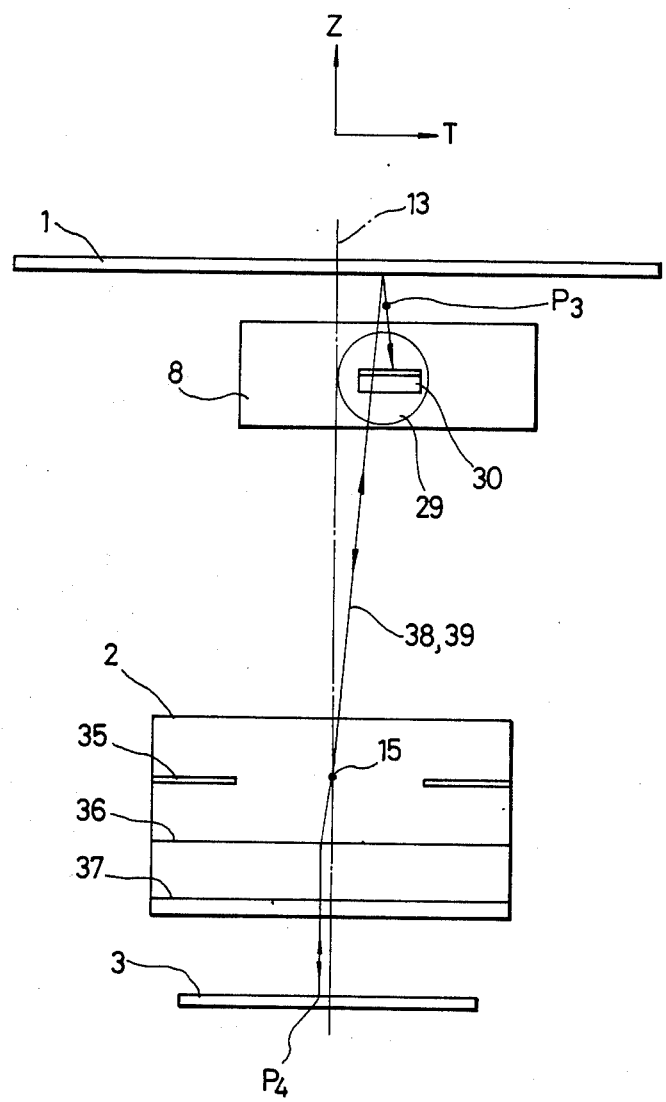

Generally speaking, the emanating eye of the focusing lens of the projecting exposure apparatus is in an infinitely remove position. If, more specifically, the wafer illuminating light 38 passes through the straight line 15 on which the plane containing the center of the entrance pupil 35 of the focusing lens 2 intersects with the entrance pupil plane 35, as shown in FIG. 22, the angle of incidence upon the wafer becomes normal (as at $P_4$) in front view of the alignment optical system, and the return path is the reversed optical path.

Figure 23:
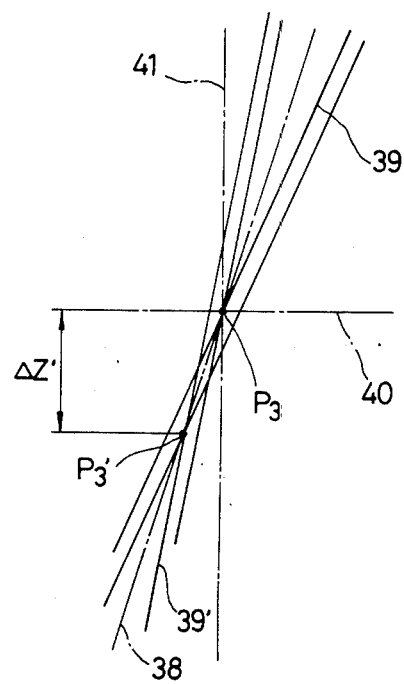

FIG. 23 shows the vicinity of the spot $P_3$ in an enlarged scale. Since the illuminating light and the center of the flux of the reflected light from the wafer pass through the same path as the optical path 38, the position in the conjugate plane 40 of the sensor is constant even with a shift in the image plane due to the wafer fluctuations $\Delta Z'$. As a result, no alignment error is caused.

Figure 24:
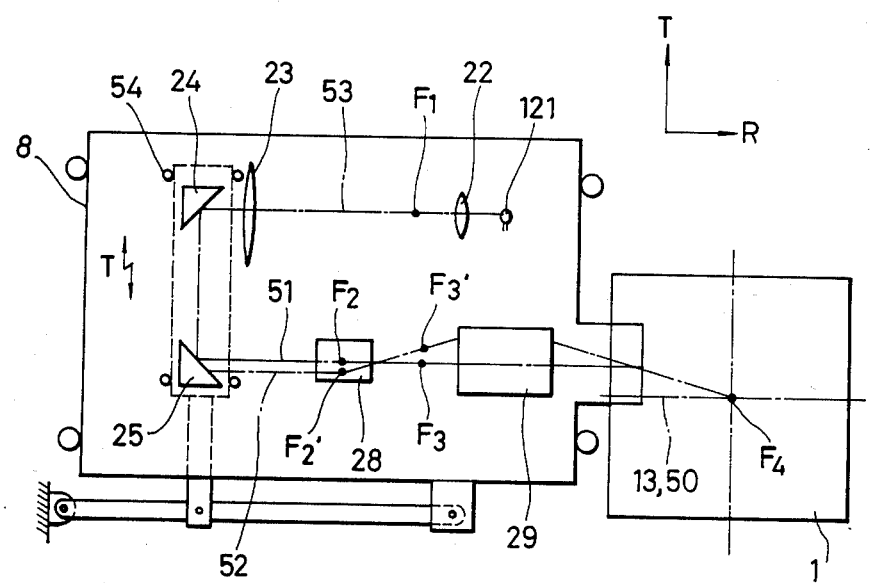
FIG. 24 is a top plan view showing the alignment optical system according to one embodiment of the present invention.

The embodiment of the present invention will be described more specifically. FIG. 24 is a top plan view showing the portion relating to the wafer illumination of the alignment optical system. When the optical axis plane 51 of the alignment optical system is displaced in parallel with the tangential (i.e., T) direction from the optical axis plane 50 of the mask 1 and the focusing lens, the conjugate point of the center $F_4$ of the entrance pupil is formed at the position $F'_3$ and further at the position $F'_2$. If, therefore, the mirrors 24 and 25 are placed on a small stage 54 in the alignment optical system 8 so that they are moved simultaneously in the T direction with a stroke proportional to the movement of the alignment optical system, the light from an optical axis 53, which intrinsically passes through the optical axis plane 51 so that it is condensed at the position $F_2$, passes through an optical axis plane 52 and is condensed at the position $F'_2$ until it passes through the position $F_4$, i.e., the center of the entrance pupil. If the galvano meter 21 is driven, the position $F_4$ moves in the plane 13 containing the entrance pupil.

Since the movement of the stage 54 carrying the mirrors 24 and 25 is proportional to that of the alignment optical system 8 in the tangential direction, this tangential movement may be reduced by means of a wedge or lever mechanism and transmitted to the stage 54.

Similar effects can also be realized by moving the lens 23 finely in the tangential direction. In order that a method using the Fresnel zone pattern may be used as the alignment method to effect the alignment of the exposure position, as shown in FIG. 26, the center 61 of the flux of the wafer illuminating light has to be aligned with the center P of the entrance pupil of the focusing lens 2 in case an alignment optical system 60 is moved in the orthogonal or radial direction, as shown in FIG. 25. reference numeral 62 indicates a laser; numerals 63, 64 and 65 lenses; numeral 66 a half mirror; numerals 67 and 68 mirrors; numeral 69 a sensor; and numeral 70 a Fresnel zone pattern. Alignment can be realized if the lens 63 is moved in the orthogonal (T) direction in proportion to the movement of the alignment optical system 60 in the same orthogonal direction.

Although the mask alignment mark shown in FIG. 3 is used in the aforementioned embodiment, the present invention is not limited to that configuration. For example, when alignment is conducted with the ray of a g line or a ray near the same, there is adopted a method of detecting the alignment mark itself on the mask as the image. In this case, it is apparent that alignment can be realized in the exposure position by moving the whole alignment detecting system of the present invention. In this embodiment, only the mirror surface is used as the mask pattern of FIG. 3; it has no hyperbolic pattern at its two sides, but its peripheral position is used as the mask pattern.

Although the mask mirror surface is used as a portion of the alignment detecting optical system in the present invention, the present invention can also be applied to the case in which the detection is made by providing a separate mirror surface.

Furthermore, the present invention detects the wafer and the mask by means of the common optical system but can be applied to the case in which they are detected by separate optical systems. In this modification, for example, the mask pattern is always arranged in the fixed position on the mask so that it may be detected by the fixed mask pattern detector, or the mask pattern is moved in parallel in accordance with the displacement of the wafer alignment pattern so that the mask pattern detector may be moved in parallel with the wafer pattern detector.

As has been described hereinbefore, according to the present invention, the alignment for each chip required for the exposure of the fine circuit pattern having a high mounting density can be realized in the exposure position. As a result, the alignment accuracy achieved reaches as high as 0.1 microns, and the exposure can be made instantly after the alignment so that the output achieved can be about two times as high as that of the prior art Another important feature of the present invention is that the alignment in the exposure position can be realized without being troubled by the changes in the chip size, the focal displacement due to chromatic aberration or fluctuations of the wafer in the Z direction.

What is claimed is:

1. A semiconductor exposure apparatus comprising:
a mask;
an exposure light source for illuminating a pattern on said mask;
a focusing lens for focusing the pattern of said mask on a wafer;
alignment means having at least a lens, a mirror and array sensor for detecting the relative positions of an alignment mark formed on said mask and an alignment mark formed on said wafer;
a first means for moving an x-y table supporting said wafer;
a second means for moving said alignment means in an orthogonal direction with respect to the optical axis of said focusing lens; and
means for introducing an alignment light, through the face of said mask, opposed to a face illuminated by exposure light.

2. A semiconductor exposure apparatus according to claim 1, wherein the alignment light is produced by a reflection of a mirror pattern formed on said mask.

3. A semiconductor exposure apparatus according to claim 1, wherein the alignment light is produced by a reflection on a mirror pattern which is formed on said mask and which has a diffraction pattern.

4. A semiconductor exposure apparatus according to claim 1, wherein the alignment light is produced by a reflection on a mirror pattern which is formed on said mask and which has a hyperbolic pattern.

5. A semiconductor exposure apparatus according to claim 1, wherein said second means for moving said alignment means in an orthogonal direction with respect to the optical axis of said focusing lens and a mechanism for moving the same in a tangential direction with respect to said orthogonal direction are integrally constructed.

6. A semiconductor exposure apparatus comprising:
a mask;
an exposure light source for illuminating a pattern on said mask;
a focusing lens for focusing the pattern of said mask on a wafer;
alignment means for detecting the relative positions of an alignment mark formed on said mask and an alignment mark formed on said wafer;
a first means for moving an x-y table supporting said wafer;
a second means for moving said alignment means in an orthogonal direction with respect to the optical axis of said focusing lens;
means for introducing an alignment light, through the face of said mask, opposed to a face illuminated by exposure light; and
means for making the center of the flux of the alignment light for illuminating the alignment pattern of said wafer incident upon a line of intersection between a plane containing the optical axis of an alignment optical system and the optical axis of said focusing lens and the entrance pupil plane of said focusing lens.

7. A semiconductor exposure apparatus according to claim 6, wherein said incidence means is made movable in association with said orthogonal moving means.

8. A semiconductor exposure apparatus comprising:
a mask;
an exposure light source for illuminating a pattern on said mask;
a focusing lens for focusing the pattern of said mask on a wafer;
alignment means for detecting the relative positions of an alignment mark formed on said mask and an alignment mark formed on said wafer;
a first means for moving an x-y table supporting said wafer;
a second means for moving said alignment means in an orthogonal direction with respect to the optical axis of said focusing lens;
means for introducing an alignment light, through the face of said mask, opposite a face illuminated by exposure light;
a diffraction pattern formed as an alignment mark on said mask; and
means for aligning the optical path of the light beam, which comes from an alignment optical system for illuminating said alignment mark formed of the diffraction pattern, into parallel with a straight line joining said alignment mark and the center of the entrance pupil of said focusing lens.

9. A semiconductor exposure apparatus according to claim 8, wherein said diffraction pattern is formed of a hyperbolic pattern.

10. A semiconductor exposure apparatus according to claim 8, wherein said diffraction pattern is formed of a Fresnel zone pattern.

11. An alignment method in a semiconductor exposure apparatus, of aligning an alignment mask formed on a wafer with an alignment mark formed on a mask by focusing a pattern of said mask on said wafer by means of a focusing lens, comprising the steps of:

moving an alignment optical system for said alignment in orthogonal directions with respect to the optical axis of said focusing lens and in tangential directions with respect to said orthogonal directions; and aligning the optical path of an alignment light beam, which is emitted from an alignment optical system for illuminating the alignment mark formed of a diffraction pattern on said mask, into parallel with a straight line joining said alignment mark formed of the diffraction pattern and the entrance pupil of said focusing lens.

12. A semiconductor exposure apparatus according to claim 8, wherein said alignment means includes:

an alignment light source fixed relative to said focusing lens;

a concave lens;

a convex lens fixed on a stage, which carries an alignment optical system for said alignment thereon for moving the same in an orthogonal direction with respect to the optical axis of said focusing lens, and having both its distance (M) from said mask and its focal length (N) made equal to the distance (L) between the incident eye of said focusing lens and said mask;

means for moving the focal point of said convex lens on a straight line extending in an orthogonal direction of said focusing lens through the focal point of said concave lens at the side of said focusing lens; and means for aligning the optical path of a light beam, which comes from an alignment optical system for illuminating said diffraction pattern, into parallel with a straight line joining said alignment mark formed of the diffraction pattern and the center of the entrance pupil of said focusing lens.

* * * * *